(12) United States Patent
Mau et al.

(10) Patent No.: US 6,811,957 B1
(45) Date of Patent: Nov. 2, 2004

(54) PATTERNED CARBON NANOTUBE FILMS

(75) Inventors: Albert Mau, Wheelers Hill (AU);
Li-ming Dai, Wheelers Hill (AU);
Shaoming Huang, Clayton (AU); Yong Yuan Yang, Beijing (CN); Hui Zhu He, Beijing (CN)

(73) Assignee: Commonwealth Scientific and Industrial Research Organisation, Australian Capital Territory (AU)

( * ) Notice: Subject to any disclaimer, the term of this patent is extended or adjusted under 35 U.S.C. 154(b) by 0 days.

(21) Appl. No.: 09/979,793

(22) PCT Filed: May 25, 2000

(86) PCT No.: PCT/AU00/00549
§ 371 (c)(1),
(2), (4) Date: Mar. 15, 2002

(87) PCT Pub. No.: WO00/73203
PCT Pub. Date: Dec. 7, 2000

(30) Foreign Application Priority Data

May 28, 1999 (AU) .............................. PQ 0649

(51) Int. Cl.[7] .................................. G03F 7/00
(52) U.S. Cl. ...................... 430/315; 430/311
(58) Field of Search .............. 430/311, 315, 430/322, 324

(56) References Cited

U.S. PATENT DOCUMENTS

| | | | |
|---|---|---|---|
| 5,726,524 A | 3/1998 | Debe | 313/309 |
| 5,872,422 A | 2/1999 | Xu et al. | 313/311 |
| 5,973,444 A | 10/1999 | Xu et al. | 313/309 |
| 6,062,931 A | 5/2000 | Chuang et al. | 445/24 |

FOREIGN PATENT DOCUMENTS

| | | |
|---|---|---|
| EP | 0 947 466 A1 | 10/1999 |
| WO | WO 98/42620 A1 | 10/1998 |
| WO | WO 99/65821 A | 12/1999 |

OTHER PUBLICATIONS

Chemical Physics Letters 316 (2000) 349–355 Jan. 21, 2000, Structure and Growth of Aligned Carbon Nanotube Films by Pyrolysis, D–C. Li.

*Primary Examiner*—Kathleen Duda
(74) *Attorney, Agent, or Firm*—Sughrue Mion, PLLC

(57) ABSTRACT

This invention relates to a process for preparing a patterned layer of aligned carbon nanotubes on a substrate including: applying a photoresist layer to at least a portion of a surface of a substrate capable of supporting nanotube growth, masking a region of said photoresist layer to provide a masked portion and an unmasked portion, subjecting said unmasked portion to electromagnetic radiation of a wavelength and intensity sufficient to transform the unmasked portion while leaving the masked portion substantially untransformed, said transformed portion exhibiting solubility characteristics different to said untransformed portion, developing said photoresist layer by contacting with a solvent for a time and under conditions sufficient to dissolve one of said transformed and untransformed portions of the photoresist, leaving the other portion attached to said substrate, synthesising a layer of aligned carbon nanotubes on regions of said substrate to which said remaining photoresist portion is not attached to provide a patterned layer of aligned carbon nanotubes on said substrate.

35 Claims, 4 Drawing Sheets

SCHEMATIC DIAGRAM OF THE PATTERNED ALIGNED CARBON NANOTUBES BY THE PHOTOLITHOGRAPHIC PROCESS

25nm
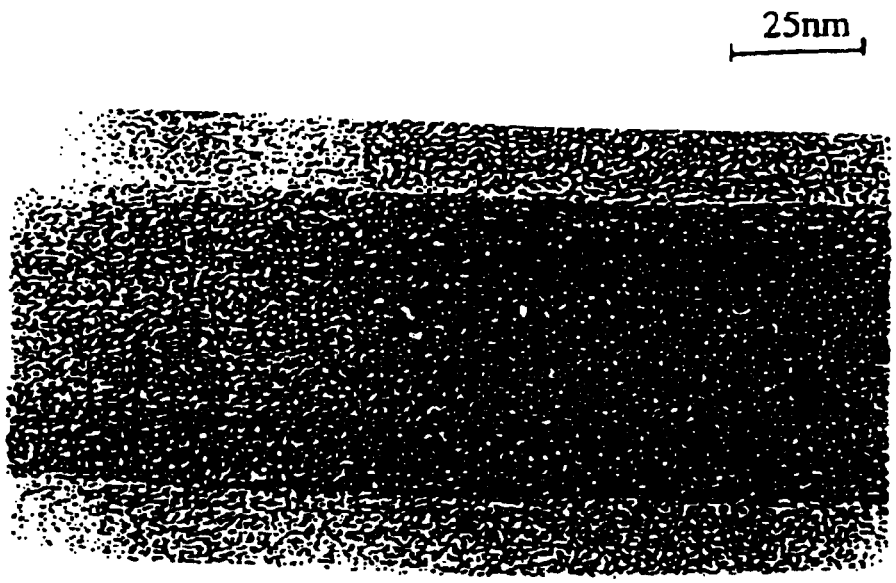
(b)
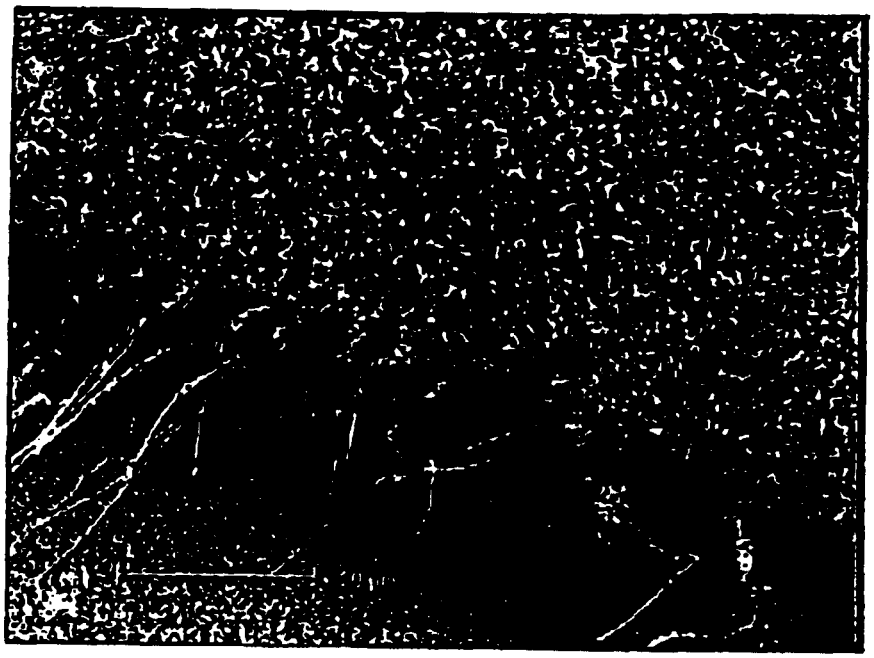
(a)
FIGURE 2

SCHEMATIC DIAGRAM OF THE PATTERNED ALIGNED CARBON NANOTUBES BY THE PHOTOLITHOGRAPHIC PROCESS

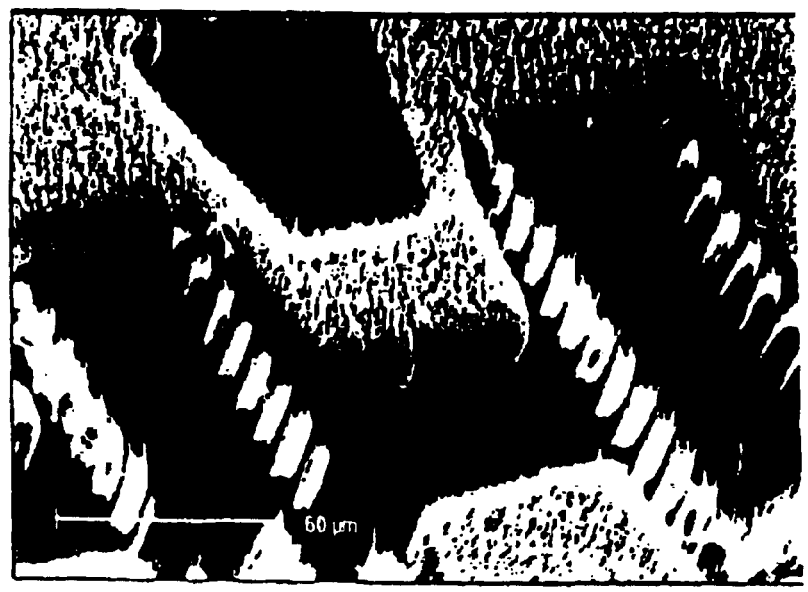
FIGURE 4

PATTERNED CARBON NANOTUBE FILMS

BACKGROUND OF THE INVENTION

This is a National Stage entry under 35 U.S.C. §371 of Application NO. PCT/AU00/00549 filed May 25, 2000, and the complete disclosure of which is incorporated into this application by reference.

This invention relates to carbon nanotube materials and processes for their preparation. In particular the invention relates to patterned aligned carbon nanotube films and to processes for their preparation which involve the use of photoresist materials. The invention also relates to the construction of devices from such materials for practical applications in many areas including as electron field emitters, artificial actuators, chemical sensors, gas storages, molecular-filtration membranes, energy-absorbing materials, molecular transistors and other optoelectronic devices.

Carbon nanotubes usually have a diameter in the order of tens of angstroms and the length of up to several micrometers. These elongated nanotubes consist of carbon hexagons arranged in a concentric manner with both ends of the tubes normally capped by pentagon-containing, fullerene-like structures. They can behave as a semiconductor or metal depending on their diameter and helicity of the arrangement of graphitic rings in the walls, and dissimilar carbon nanotubes may be joined together allowing the formation of molecular wires with interesting electrical, magnetic, non-linear optical, thermal and mechanical properties. These unusual properties have led to diverse potential applications for carbon nanotubes in material science and nanotechnology. Indeed, carbon nanotubes have been proposed as new materials for electron field emitters in panel displays, single-molecular transistors, scanning probe microscope tips, gas and electrochemical energy storages, catalyst and proteins/DNA supports, molecular-filtration membranes, and energy-absorbing materials (see, for example: M. Dresselhaus, et al., *Phys. World,* January, 33, 1998; P. M. Ajayan, and T. W. Ebbesen, *Rep. Prog. Phys.,* 60, 1027, 1997; R. Dagani, *C & E News,* January 11, 31, 1999).

For most of the above applications, it is highly desirable to prepare aligned carbon nanotubes so that the properties of individual nanotubes can be easily assessed and they can be incorporated effectively into devices. Carbon nanotubes synthesised by most of the common techniques, such as arc discharge (Iijima, S. *Nature* 354, 56–58, 1991; Ebbesen, T. W. & Ajayan, P. M. *Nature* 358, 220–222, 1992) and catalytic pyrolysis (See, for example: Endo. M et al. *J. Phys. Chem. Solids* 54, 1841–1848, 1994; Ivanov. V. et al., *Chem. Phys. Let.* 223, 329–335, 1994), often exist in a randomly entangled state (See, for example: T. W. Ebbesen and P. M. Ajayan, *Nature* 358, 220, 1992. However, aligned carbon nanotubes have recently been prepared either by post-synthesis manipulation (see, for example: Aegean, P. M., et al., *Science* 265, 1212–1214, 1994; De Heer, W. A. et al. *Science* 268, 845–847, 1995) or by synthesis-induced alignment (see, for example: W. Z. Li, *Science,* 274, 1701, 1996; Che, G., *Nature,* 393, 346, 1998; Z. G. Ren, et al., *Science,* 282, 1105, 1998; C. N., Rao, et al.,*J. C. S., Chem. Commun,* 1525, 1998).

The number of techniques which have been reported for the pattern formation of aligned carbon nanotubes is very limited (S. Fan, M. G. Chapline, N. R. Franklin, T. W. Tombler, A. M. Cassell, and H. Dai, *Science,* 283, 512, 1999; S. Huang, L. Dai, and A. W. H. Mau, *J. Phys, Chem.,* 103 issue 21, 4223–4227), and the achievable resolutions of the nanotube patterns was, at the best, at several micrometer scale in these cases.

It has now been found that pattern formation of perpendicularly aligned carbon nanotubes with resolutions up to a sub-micrometer scale can be achieved using a novel photolithographic technique.

SUMMARY OF THE INVENTION

According to a first aspect, the present invention provides a process for preparing a patterned layer of aligned carbon nanotubes on a substrate including:

applying a photoresist layer to at least a portion of a surface of a substrate capable of supporting nanotube growth, masking a region of said photoresist layer to provide a masked portion and an unmasked portion, subjecting said unmasked portion to electromagnetic radiation of a wavelength and intensity sufficient to transform the unmasked portion while leaving the masked portion substantially untransformed, said transformed portion exhibiting solubility characteristics different to said untransformed portion, developing said photoresist layer by contacting with a solvent for a time and under conditions sufficient to dissolve one of said transformed and untransformed portions of the photoresist, leaving the other portion attached to said substrate, synthesising a layer of aligned carbon nanotubes on regions of said substrate to which said remaining photoresist portion is not attached to provide a patterned layer of aligned carbon nanotubes on said substrate.

It has been found that this photolithographic patterning method, together with a novel contact printing transfer technique, allows the pattern formation of aligned carbon nanotubes on various substrates at a micrometer/submicrometer resolution. The technique provides a route to patterned formations of aligned carbon nanotubes which have not been achievable according to methods described in the prior art. The process according to the present invention is easy to perform and provides a convenient route to patterned aligned carbon nanotubes with controllable geometries.

The term "photoresist" is used herein in its broadest sense to refer to any organic material capable of polymerising or otherwise transforming upon exposure to electromagnetic radiation such that, upon exposure, its solubility characteristics are changed relative to unexposed material. Examples of such photoresponsive materials include, but are not limited to, diazonaphthoquinone (DNQ)-based photoresists, such as cresol novolac resin (from Shipley), Ozatec PK 14 (from Hoechst), as well as other possible polymers including, inter alia, epoxy resins, polyanilines, polymethyl methacrylate, polystyrenes, and polydienes.

The mechanism of the transformation following exposure to electromagnetic radiation is illustrated below with reference to the cresol novolac resin described above. Its structure is as follows:

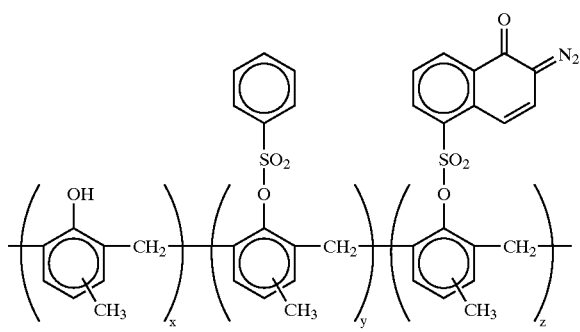

The reactions which occur following illumination with UV light are illustrated diagrammatically in Scheme 1 below:

metals include Au, Pt, Cu, Cr, Ni, Fe, Co and Pd. Examples of suitable compounds are metal oxides, metal carbides, metal nitrides, metal sulfides and metal borides. Examples of suitable metal oxides include indium tin oxide (ITO), $Al_2O_3$, $TiO_2$ and MgO. Examples of semiconducting materials include gallium arsenide, aluminium arsenide, aluminium sulphide and gallium sulphide.

The patterning of the aligned carbon nanotubes is achieved by creating a region on the substrate which is incapable of supporting nanotube growth. The pattern is created on the substrate by applying an appropriate mask to the photoresist layer such that part of the photoresist layer is capable of being exposed to electromagnetic radiation, while the remaining photoresist layer is substantially shielded from such electromagnetic radiation. Depending on the solubility properties of the exposed and unexposed photoresist, the patterning of the subsequently synthesised aligned carbon nanotube layer will be defined by the positive or negative of the mask.

Scheme 1

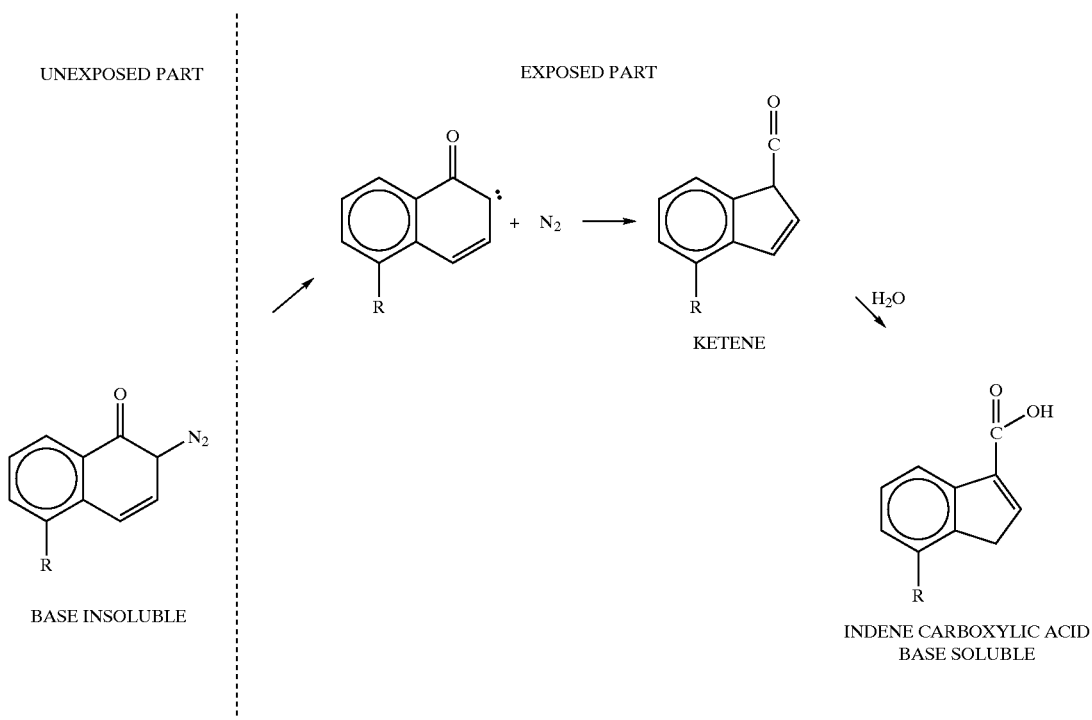

As can be seen the base insoluble resin is transformed into a base soluble entity following exposure to light.

The substrate to which the photoresist layer is applied can be any substrate which is capable of withstanding the pyrolysis or CVD (chemical vapour deposition) conditions employed, for nanotube growth and which is capable of supporting aligned carbon nanotube growth. Examples of suitable substrates include all types of glass that provide sufficient thermal stability according to the synthesis temperature applied, such as quartz glass, as well as alumina, graphite, mica, mesoporous silica, silicon wafer, nanoporous alumina or ceramic plates. Preferably the substrate is glass, in particular, quartz glass or silicon wafer. The substrate may also include a coating of a material which is capable of supporting carbon nanotube growth under the conditions employed. The coating may be of any metal, metaloxide, metal alloy or compound thereof, which may have conducting or semiconducting properties. Examples of suitable One suitable mask is a quartz plate coated with a thin layer of metal micropatterns, where the regions covered by the thin metal layer are opaque while the uncovered areas are transparent to a photo-irradiation beam. The photomask may be applied to the photoresist layer by physical pressing.

When the mask is applied to the photoresist layer the photoresist coated substrate is subjected to electromagnetic radiation to transform the exposed region of the photoresist. The transformation which is undergone by the photoresist will depend on the nature and properties of the photoresist. Accordingly the transformation may represent a polymerisation, an oxidation, or other chemical transformation of the photoresist material. The transformation should be specific to the exposed region, should result in a change in solubility characteristics relative to the unexposed photoresist, and should be sufficiently permanent to enable selective solubilisation of the exposed or the unexposed photoresist.

The electromagnetic radiation used to irradiate the exposed photoresist material will depend on the nature of the photoresist material used, however for most applications the electromagnetic radiation will be UV radiation.

The photoresist layer is then developed by contact with a solvent which is capable of dissolving the portion of the photoresist layer which is to later support growth of aligned carbon nanotubes into the desired pattern. This will be either the exposed (transformed) region or the unexposed (untransformed) region. The contact with the solvent should be such that the non-dissolved region of the photoresist remains attached to the substrate.

The nature of the solvent used will depend on the type of photoresist utilised and the nature of the transformation which it undergoes on exposure to electromagnetic radiation. In the case of cresol novolac resin (which is base insoluble) exposure to UV radiation produces a carboxylic acid moiety which is soluble in base. Accordingly the exposed region of the photoresist can be dissolved using aqueous solution of a suitable base, such as an alkali metal hydroxide, ammonium hydroxide, tetramethylammonium hydroxide or other organic bases. Alternatively a solvent can be selected which dissolves the unexposed region of the photoresist, such as ethylene glycol, butanediol, dimethyl ether, diethyl ether, methyl ethyl ether, acetone, methyl ethyl ketone, and similar solvents. With other photoresists the selection of a suitable solvent may be made between polar solvents, such as water, ethanol, methanol, acetone and the like on the one hand and non-polar solvents, such as benzene, toluene and the like on the other hand. A person skilled in the art would be readily able to select a suitable solvent to dissolve the desired region of the photoresist.

The next step in the process involves the synthesis of a layer of aligned carbon nanotubes on the region of the substrate from which the photoresist has been dissolved. This may be achieved using a suitable technique for the synthesis of perpendicularly aligned carbon nanotubes. Preferably the aligned carbon nanotubes are prepared by pyrolysis of a carbon-containing material in the presence of a suitable catalyst for nanotube formation.

The carbon-containing material may be any compound or substance which includes carbon and which is capable for forming carbon nanotubes when subjected to pyrolysis in the presence of a suitable catalyst. Examples of suitable carbon-containing materials include alkanes, alkenes, alkynes or aromatic hydrocarbons and their derivatives, for example methane, acetylene, benzene, organometallic compounds of transition metals, for example transition metal phthalocyanines, such as Fe(II) phthalocyanine, and metallocenes such as ferocene and nickel dicyclopentadiene and any other suitable evaporable metal complex.

The catalyst may be any compound, element or substance suitable for catalysing the conversion of a carbon-containing material to aligned carbon nanotubes under pyrolytic conditions. The catalyst may be a transition metal, such as Fe, Co, Al, Ni, Mn, Pd, Cr or alloys thereof in any suitable oxidation state.

The catalyst may be incorporated into the substrate or may be included in the carbon-containing material. Examples of carbon-containing materials which include a transition metal catalyst are Fe(II) phthalocyanine, Ni(II) phthalocyanine and ferrocene. When the catalyst and carbon-containing material are included in the same material it may be necessary to provide sources of additional catalyst or additional carbon-containing material. For example, when ferrocene is used as the catalyst and a source of carbon, it is necessary to provide an additional carbon source, such as ethylene, to obtain the required nanotube growth.

The pyrolysis condition employed will depend on the type of carbon-containing material employed and the type of catalyst, as well as the length and density of the nanotubes required. In this regard it is possible to vary the pyrolysis conditions, such as the temperature, time, pressure or flow rate through the pyrolysis reactor, to obtain nanotubes having different characteristics.

For example, performing the pyrolysis at a higher temperature may produce nanotubes having different base-end structures relative to those prepared at a lower temperature. The pyrolysis will generally be performed with a temperature range of 500° C. to 1100° C. Similarly lowering the flow rate through a flow-type pyrolysis reactor may result in a smaller packing density of the nanotubes and vice versa. A person skilled in the art would be able to select and control the conditions of pyrolysis to obtain nanotubes having the desired characteristics.

After synthesis of the layer of aligned carbon nanotubes in the pattern array on the substrate, the photoresist material remaining on the substrate may be dissociated from the carbon nanotubes. This may be achieved using a solvent capable of dissolving the remaining photoresist layer. Alternatively it is possible to disassociate the carbon nanotubes from the substrate by transferring the patterned carbon nanotube layer to another substrate. This other substrate may be another substrate capable of supporting carbon nanotube growth, or may be a metal, metal oxide, semi-conductor material or a polymer. Examples of suitable polymers include adhesive coated polymers such as cellulose tape, conjugated (conducting) polymers, temperature/pressure responsive polymers, bioactive polymers and engineering resins.

Where the patterned layer of aligned carbon nanotubes is transferred to another substrate which is capable of supporting carbon nanotube growth, it is possible to form a heterostructured nanotube film by subjecting the nanotube coated substrate to conditions for promoting aligned carbon nanotube growth. The conditions of nanotube formation may be controlled or adjusted such that the length of the further nanotubes is different to the length of the nanotubes making up the original patterned layer. This second layer of nanotubes will tend to grow in the spaces defined by the original patterned layer. It may also be possible to adjust conditions such that there is some further nanotube growth on top of the original patterned layer.

The nanotube patterns on quartz plates may also be separated from the substrate, while retaining the integrity of the pattern by immersing the sample in an aqueous hydrofluoric acid solution (10–40% w/w) for an appropriate period.

For some applications, the patterned carbon nanotube film may be incorporated into a multilayer structure including layers of other materials, such as metals, metal oxides, semiconductor materials or polymers.

The patterned carbon nanotube film prepared in accordance with the present invention and the devices including these patterned films represent further aspects of the present invention.

The patterned film prepared in accordance with any one of the processes of the present invention and devices, materials coated with or including these multilayer films represent further aspects of the present invention.

As is evident from the above description the invention allows the preparation of a large variety of patterned films and structures. The processes of the present invention and the patterned structures formed may have use in the following applications:

1) electron emitters
2) field-emission transistors
3) electrodes for photovoltaic cells and light emitting diodes with region-specific characteristics
4) optoelectronic elements
5) bismuth actuators
7) chemical and biological sensors with region-specific characteristics
8) gas storages
9) molecular-filtration membranes
10) region-specific energy absorbing materials.

BRIEF DESCRIPTION OF THE DRAWINGS

The invention will now be described with reference to the following examples and drawings which illustrate some preferred embodiments of the invention. However it should be understood that the particularity of the following description is not to supersede the generality of the invention previously described.

Referring to the drawings:

FIG. 2a is a scanning electron microscopic image of aligned carbon nanotubes on a quartz glass substrate.

FIG. 2b is a high resolution transmission electron microscopic image of an individual carbon nanotube.

FIG. 4 is a scanning electron microscopic image of a patterned layer of aligned carbon nanotubes.

DETAILED DESCRIPTION OF THE INVENTION

EXAMPLES

Example 1

Preparation of Aligned Carbon Nanotubes

Figure 1:
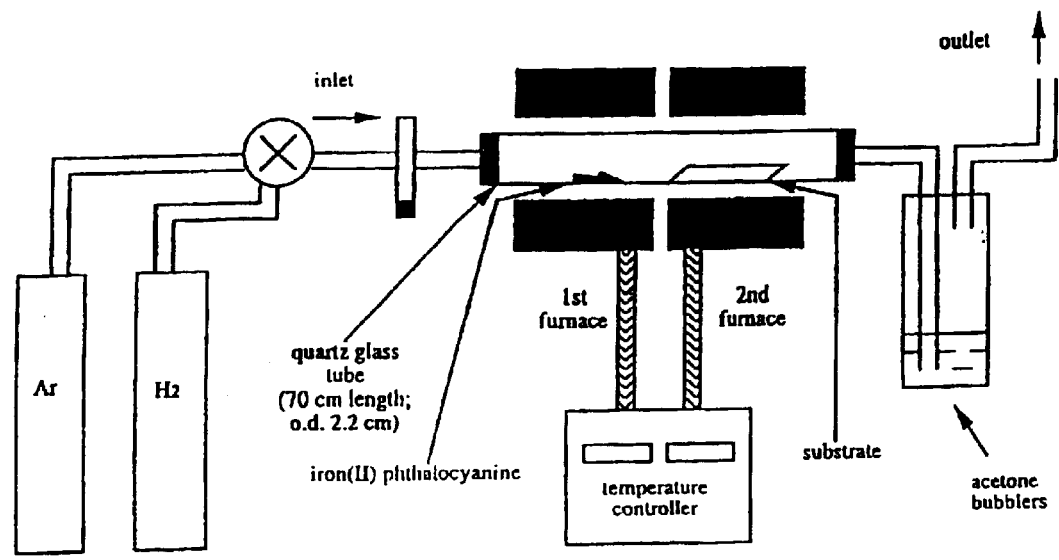
FIG. 1 is a diagrammatic representation of a pyrolysis flow reactor suitable for preparing aligned carbon nanotubes.

Aligned carbon nanotubes were prepared by pyrolysis of iron (II) phthalocyanine under Ar/$H_2$ at 800–1100° C. using a quartz plate in a flow reactor consisting of a quartz glass tube and a dual furnace fitted with independent temperature controllers (FIG. 1). FIG. 2a represents a typical scanning electron microscopic (SEM, XL-30 FEG SEM, Philips, at 5 KV) image of the carbon nanotubes, showing that the as-synthesised nanotubes align almost normal to the substrate surface. The aligned nanotubes are densely packed with a fairly uniform tubular length of ca. 25 $\mu$m. However, the length of the aligned nanotubes can be varied over a wide range (from a few to several tens of micrometers) in a controllable fashion by changing the experimental conditions (e.g. the pyrolysis time, flow rate). A well-graphitised structure with ca. 40 concentric carbon shells and an outer diameter of ca. 40 nm is illustrated in the high resolution transmission electron microscopic HR-TEM, CM30, Philips, at 300 KV) image of an individual nanotube (FIG. 2b).

Example 2

Preparation of Photoresist Patterned Quartz Glass Plates

Figure 3:
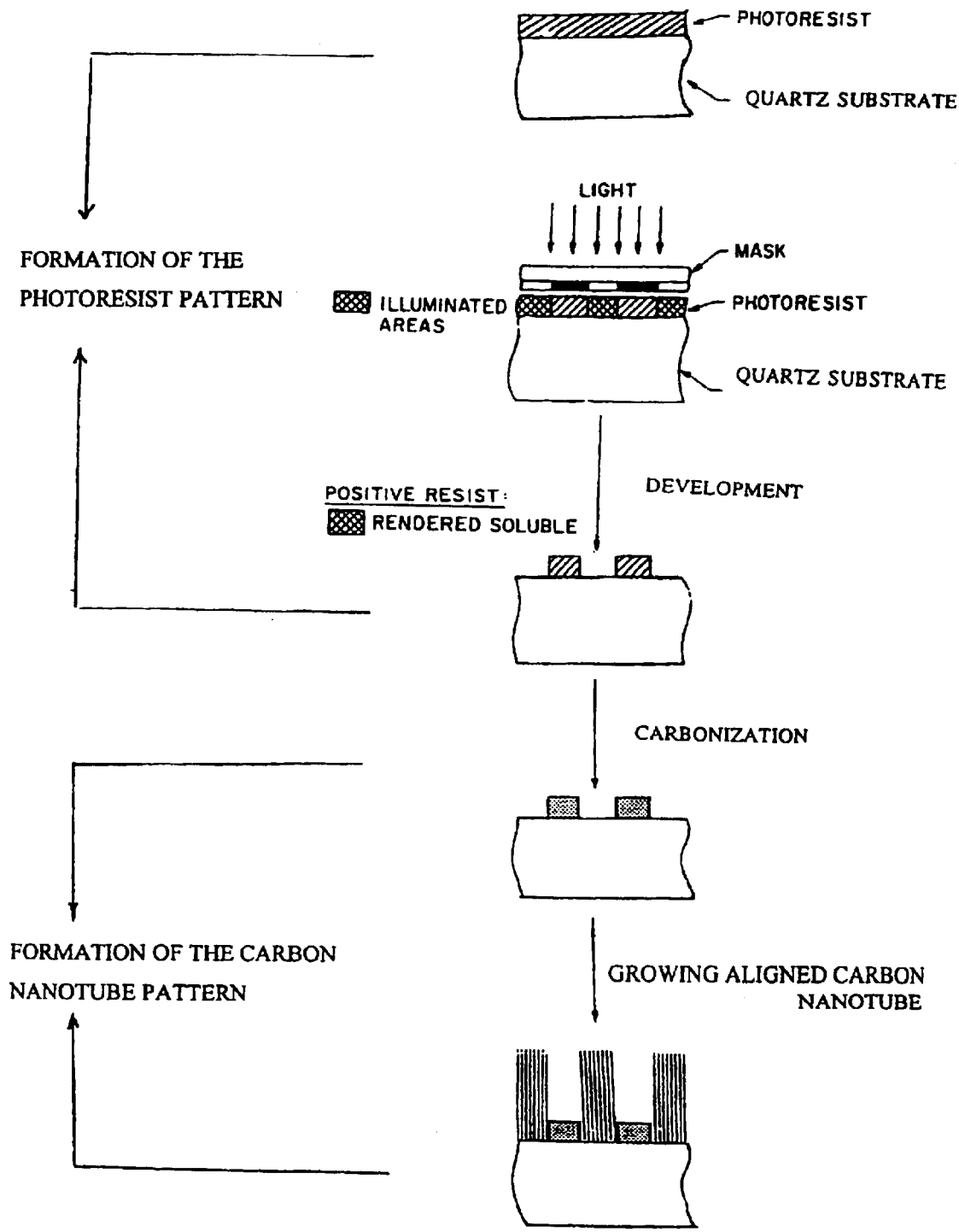
FIG. 3 is a schematic diagram showing the stages involved in the preparation of a patterned layer of aligned carbon nanotubes according to the embodiment of the invention.

In this example cresol novolac resin was used as a positive photoresist. The indene carboxylic acid derivative of the photoresist formed in regions exposed to UV is base soluble while the unexposed photoresist remains to be insoluble under the same conditions. The steps involved in forming the pattern are shown schematically in FIG. 3. A photoresist solution was prepared by dissolving 30 g of naphthoquinone diazid-cresol novolac resin in 100 mL ethoxy ethyl acetate. Spin-casting of the photoresist solution onto a quartz glass plate resulted in the formation of a photoresist coating, which was baked in an oven at 80° C. for 10 min. The resultant dry photoresist layer (0.2 $\mu$m thick) was then exposed through a photomask to EIMAC, VARIAN R150-8 at a lamp-sample distance of 111 cm for 30 sec. The photoresist was then developed in a 1% sodium hydroxide solution for 8 sec. After rinsing with distilled water, the photoresist patterned quartz plate was further baked at 80° C. for 10 min.

Example 3

Preparation of the Aligned Nanotube Patters

The photoresist prepatterned quartz plate prepared in Example 2 was used for growing the aligned nanotubes in accordance with the process described in Example 1. The aligned nanotube pattern thus prepared is shown in FIG. 4, the nanotube pattern showing a close replication of the photomask structure. As seen in FIG. 4, aligned nanotube bundles at a submicrometer scale are clearly evident.

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

Those skilled in the art will appreciate that the invention described herein is susceptible to variations and modifications other than those specifically described. It is to be understood that the invention includes all such variations and modifications. The invention also includes all of the steps, features, compositions and compounds referred to or indicated in this specification, individually or collectively, and any and all combinations of any two or more of said steps or features.

What is claimed is:

1. A process for preparing a patterned layer of aligned carbon nanotubes on a substrate including:

applying a photoresist layer to at least a portion of a surface of a substrate capable of supporting nanotube growth, masking a region of said photoresist layer to provide a masked portion and an unmasked portion, subjecting said unmasked portion to electromagnetic radiation of a wavelength and intensity sufficient to transform the unmasked portion while leaving the masked portion substantially untransformed, said transformed portion exhibiting solubility characteristics different to said untransformed portion, developing said photoresist layer by contacting with a solvent for a time and under conditions sufficient to dissolve one of said transformed and untransformed portions of the photoresist, leaving the other portion attached to said substrate, synthesising a layer of aligned carbon nanotubes on regions of said substrate to which said remaining photoresist portion is not attached to provide a patterned layer of aligned carbon nanotubes on said substrate.

2. The process according to claim 1 wherein the photoresist layer is selected from the group consisting of DNQ-based photoresists, epoxy resins, polyanilines, polymethyl methacrylate, polystyrenes, and polydienes.

3. The process according to claim 2 wherein the photoresist layer is cresol novolac resin.

4. The process according to claim 3 wherein the solvent is a base and the transformed portion of the photoresist layer is dissolved.

5. The process according to claim 4 wherein the base is selected from the group consisting of alkali metal hydroxide, ammonium hydroxide, tetramethylammonium hydroxide and other organic bases.

6. The process according to claim 3 wherein the solvent dissolves the untransformed portion of the photoresist layer.

7. The process according to claim 6 wherein the solvent is selected from the group consisting of ethylene glycol, butanediol, dimethyl ether, diethyl ether, methyl ethyl ether, acetone, methyl ethyl ketone, and similar solvents.

8. The process according to claim 1 wherein the substrate is selected from the group consisting of quartz glass, mesaporous silica, silicon water, nanoporous alumina, ceramic plates, graphite and mica.

9. The process according to claim 8 wherein the substrate is quartz glass or silicon water.

10. The process according to claim 1 wherein the substrate comprises a coating of a material which is capable of supporting carbon nanotube growth under the conditions employed.

11. The process according to claim 10 wherein the coating is selected from the group consisting of a metal, metal alloy or compound thereof having conducting and semiconducting properties.

12. The process according to claim 11 wherein the coating is a metal selected from the group consisting of Au, Pt, Cu, Cr, Ni, Fe, Co and Pd.

13. The process according to claim 11 wherein the coating is a metal compound or metal alloy compound selected from an oxide, a carbide, a nitride, a sulfide or a boride.

14. The process according to claim 13 wherein the coating is a metal oxide selected from the group consisting of indium tin oxide (ITO), $Al_2O_3$, $TiO_2$ and MgO.

15. The process according to claim 11 wherein the coating is a semiconducting material selected from the group consisting of gallium arsenide, aluminium arsenide, aluminium sulphide and gallium sulphide.

16. The process of claim 1 wherein the electromagnetic radiation is UV radiation.

17. The process according to claim 1 wherein the aligned carbon nanotubes are synthesised by pyrolysis of a carbon-containing material in the presence of a suitable catalyst for nanotube formation.

18. The process according to claim 17 wherein the carbon-containing material is selected from alkanes, alkenes, alkynes and aromatic hydrocarbons and their derivatives, organometallic compounds of transition metals and other suitable evaporable metal complexes.

19. The process according to claim 18 wherein the carbon-containing material is selected from methane, acetylene and benzene.

20. The process according to claim 18 wherein the organometallic compound is a transition metal phthalocyanine.

21. The process according to claim 18 wherein the organometallic compound is a metallocene.

22. The process according to claim 17 wherein the catalyst is a transition metal.

23. The process according to claim 22 wherein the transition metal is selected from the group consisting of Fe, Co, Al, Ni, Mn, Pd, Cr and alloys thereof in any suitable oxidation state.

24. The process according to claim 17 wherein the catalyst is incorporated in the carbon-containing material.

25. The process according to claim 24 wherein the catalyst is selected from the group consisting of Fe(II) phthalocyanine, Ni(II) phthalocyanine and ferrocene.

26. The process according to claim 24 further comprising an additional source of catalyst.

27. The process according to claim 24 further comprising an additional source of carbon-containing material.

28. The process according to claim 17 wherein the pyrolysis is carried out at 500° C. to 1100° C.

29. The process according to claim 1 wherein the process comprises the further step of dissociating the aligned carbon nanotubes from the substrate.

30. The process according to claim 29 wherein dissociation occurs by dissolving the remaining photoresist layer.

31. The process according to claim 29 wherein the substrate is quartz glass and dissociation is effected by immersing the sample in an aqueous hydrofluoric acid solution (10–40% w/w).

32. The process according to claim 29 wherein dissociation comprises transferring the patterned carbon nanotube layer to another substrate.

33. The process according to claim 32 wherein the other substrate is selected from the group consisting of another substrate capable of supporting carbon nanotube growth, a metal, metal oxide, semi-conductor material and a polymer.

34. The process according to claim 33 wherein the polymer is selected from the group consisting of adhesive coated polymers, conjugated (conducting) polymers, temperature/pressure responsive polymers, bioactive polymers and engineering resins.

35. The process according to claim 34 wherein the adhesive coated polymer is cellullose tape.

* * * * *